(12) United States Patent
Takemasa et al.

(10) Patent No.: US 12,249,530 B2
(45) Date of Patent: Mar. 11, 2025

(54) WAFER FOR ELECTRONIC COMPONENTS

(71) Applicant: Japan Display Inc., Tokyo (JP)

(72) Inventors: Kenichi Takemasa, Tokyo (JP);
Kazuyuki Yamada, Tokyo (JP);
Keisuke Asada, Tokyo (JP); Daiki Isono, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 221 days.

(21) Appl. No.: 17/719,388

(22) Filed: Apr. 13, 2022

(65) Prior Publication Data

US 2022/0336250 A1    Oct. 20, 2022

(30) Foreign Application Priority Data

Apr. 15, 2021   (JP) .................................. 2021-069105

(51) Int. Cl.
*H01L 25/075*   (2006.01)
*H01L 21/683*   (2006.01)
*H01L 33/62*    (2010.01)

(52) U.S. Cl.
CPC ...... *H01L 21/6835* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC ................. H01L 21/6835; H01L 33/62; Y10T 428/24479
See application file for complete search history.

(56) References Cited

U.S. PATENT DOCUMENTS

| 10,770,426 B2 | 9/2020 | Hwangbo et al. | |
| 2010/0025684 A1* | 2/2010 | Shinohara | H01L 21/0262 |
| | | | 257/E21.09 |
| 2011/0128980 A1* | 6/2011 | Kato | H01L 33/0095 |
| | | | 438/33 |
| 2020/0243708 A1* | 7/2020 | Yanagawa | H01L 33/0093 |

FOREIGN PATENT DOCUMENTS

| JP | 07131069 A | * | 5/1995 |
| JP | 2003188060 A | * | 7/2003 |
| JP | 2008262993 A | | 10/2008 |
| JP | 2010225787 A | | 10/2010 |
| JP | 2015501536 A | | 1/2015 |
| JP | 2019-83280 A | | 5/2019 |

(Continued)

OTHER PUBLICATIONS

[NPL-1] Nakamura et al. (JP H07-131069 A), May 19, 1995 (EPO machine translation to English). (Year: 1995).*

(Continued)

*Primary Examiner* — Maria V Ewald
*Assistant Examiner* — Donald M Flores, Jr.
(74) *Attorney, Agent, or Firm* — XSENSUS LLP

(57) ABSTRACT

According to one embodiment, a wafer for electronic components, includes a sapphire substrate including a first surface and a second surface on an opposite side to the first surface and a plurality of electronic components located on a side of the first surface, and the sapphire substrate includes trench portions located between respective adjacent electronic components, and the trench portions extend linearly in plan view.

5 Claims, 9 Drawing Sheets

(56) References Cited

FOREIGN PATENT DOCUMENTS

| JP | 2019514217 A | | 5/2019 |
|---|---|---|---|
| KR | 2009067647 A | * | 6/2009 |

OTHER PUBLICATIONS

[NPL-2] Matsushita (JP 2003-188060 A) ; Jul. 4, 2003 (EPO machine translation to English). (Year: 2003).*
[NPL-3] Myung et al. (KR 2009-0067647 A); Jun. 25, 2009 (EPO machine translation to English). (Year: 2009).*
Japanese Office Action issued Sep. 3, 2024, in corresponding Japanese Patent Application No. 2021-069105 and machine translation, 12pp.

* cited by examiner

WAFER FOR ELECTRONIC COMPONENTS

CROSS-REFERENCE TO RELATED APPLICATIONS

This application is based upon and claims the benefit of priority from Japanese Patent Application No. 2021-069105, filed Apr. 15, 2021, the entire contents of which are incorporated herein by reference.

FIELD

Embodiments described herein relate generally to a wafer for electronic components.

BACKGROUND

In general, LED display devices which employ a light-emitting diode (LED), which is a self-luminous device, are known. In recent years, display devices which employ a micro-diode element called micro-LED, have been developed as display devices with higher resolution. Unlike the conventional liquid crystal display devices or organic EL display devices, the micro-LED display is formed with a structure in which a large number of chip-like micro-LEDs are mounted in the display area. With this structure, both high resolution and large size can be easily achieved, and therefore it is attracting attention as a next-generation display device.

As the method of mounting a large number of chip-like micro-LEDs in the display area, a method which utilizes laser lift-off (LLO) is known. Here, a plurality of micro-LEDs are formed on a sapphire substrate before being mounted on the display area. But, if the sapphire substrate is warped, the laser beam may not be irradiated to the desired position during peeling off the micro-LEDs from the sapphire substrate by LLO. In order to solve this drawback, a method to flatten the warp of the sapphire substrate by pressing the entire surface of the substrate is known.

DETAILED DESCRIPTION

Figure 1:
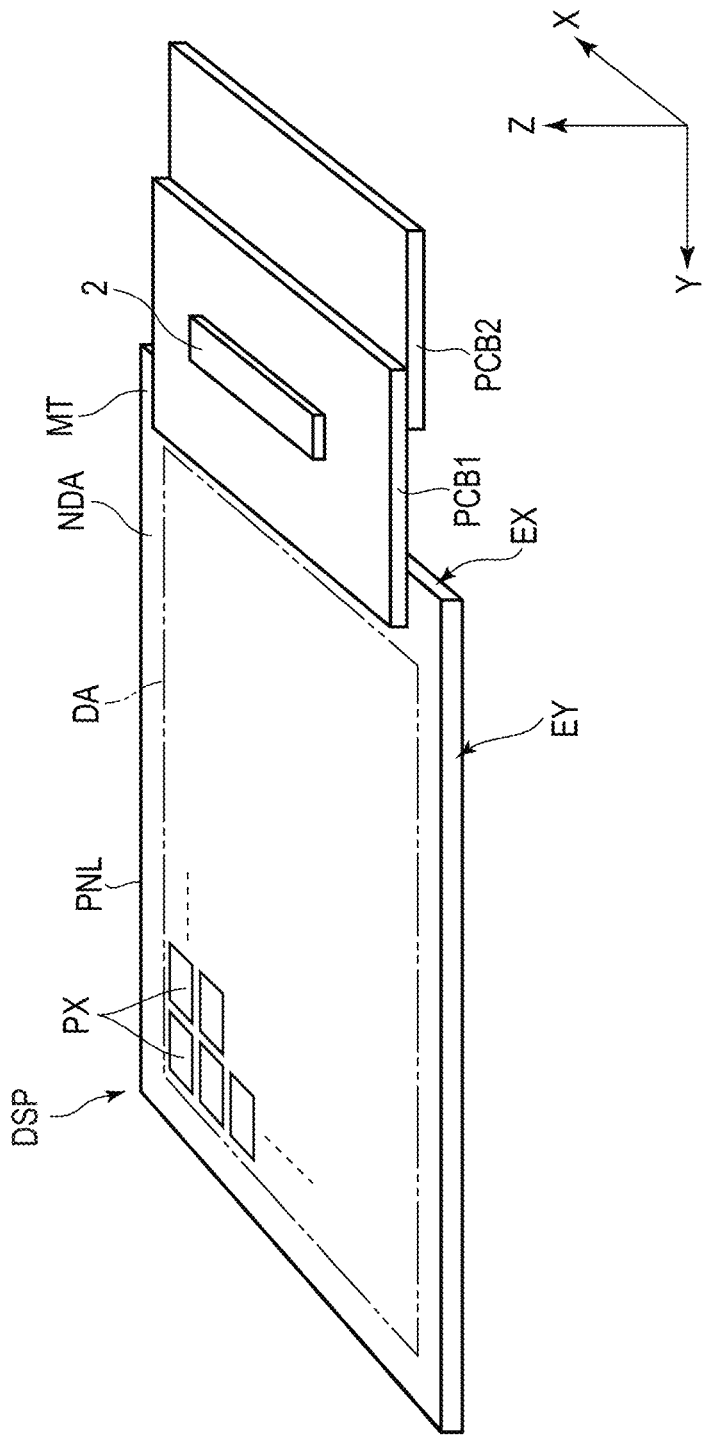
FIG. 1 is a perspective diagram schematically showing a configuration of a display device.

In general, according to one embodiment, a wafer for electronic components comprises a sapphire substrate including a first surface and a second surface on an opposite side to the first surface and a plurality of electronic components located on a side of the first surface, and the sapphire substrate includes trench portions located between respective adjacent electronic components, and the trench portions extend linearly in plan view.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a perspective diagram schematically showing a configuration of a display device DSP.

In this specification, a first direction X, a second direction Y and a third direction Z are defined as shown in the figure. The second direction Y is normal to the first direction X, and the third direction Z is normal to the first direction X and the second direction Y. The first direction X and the second direction Y intersect each other normally, but they may intersect at an angle other than being normal. In the following descriptions, the direction toward the tip of the arrow indicating the third direction Z is referred to as "up" and the direction from the tip of the arrow to an opposite direction is referred to as "down". Further, it is assumed that there is an observation position to observe the display device DSP and the manufacturing device on a tip side of the arrow indicating the third direction Z, and viewing from this observation position toward the X-Y plane defined by the first direction X and the second direction Y is referred to as a planar view.

In this specification, an LED chip (light-emitting element) used in the display device DSP is described as an example as an electronic component.

In the following descriptions, the case where the display device DSP is a micro-LED display device using a micro LED, which is a self-luminous element, will be described.

As shown in FIG. 1, the display device DSP comprises a display panel PNL, printed circuit boards PCB1 and PCB2 and a drive IC chip 2.

The display panel PNL is, for example, rectangular in shape. In the example illustrated, a short edge EX of the display panel PNL is parallel to the first direction X, and a long edge EY of the display panel PNL is parallel to the second direction Y. The third direction Z is equivalent to the thickness direction of the display panel PNL. The main surface of the display panel PNL is parallel to the X-Y plane defined by the first direction X and the second direction Y. The display panel PNL includes a display area DA and a non-display area NDA on an outer side of the display area DA. In the example illustrated, the non-display area NDA surrounds the display area DA. The display panel PNL has a terminal region MT in the non-display area NDA. The terminal area MT is provided along the short edge EX of the display panel PNL and includes terminal portions for electrically connecting the display panel PNL to an external device or the like.

The display area DA is an area for displaying images, and comprises a plurality of pixels PX arranged in a matrix, for example. The pixels PX each include a light-emitting element (micro-LED), a switching element for driving the light-emitting element, and the like.

The printed circuit board PCB1 is mounted on the terminal area MT, and is electrically connected to the display panel PNL. The printed circuit board PCB1 is, for example, a flexible printed circuit board. The printed circuit board PCB2 is connected to the printed circuit board PCB1, for example, from below the printed circuit board PCB1. The printed circuit board PCB2 is, for example, a rigid printed circuit board.

The drive IC chip 2 is mounted on the printed circuit board PCB1. Note that the driver IC chip 2 may be mounted from below the printed circuit board PCB1, or may be mounted on the non-display area NDA of the display panel PNL, or may be mounted on the printed circuit board PCB2. The drive IC chip 2 is connected to a control board, which is not shown in the figure, for example, via the printed circuit boards PCB1 and PCB2. The driver IC chip 2 carries out control including driving a plurality of pixels PX based on the video signals output from the control board and displaying the images on the display panel PNL.

In the following descriptions, how to mount the light-emitting elements LED on the circuit board CB, which serves as the base substrate of the display panel PNL described above, will be described. In more detail, a method of removing the light-emitting elements LED from a wafer WF shown in FIG. 3 by laser lift-off (LLO), and mounting them on the circuit board CB shown in FIG. 2 will be described.

First, with reference to FIGS. 2 and 3, the configuration of the circuit board CB and the wafer WF will be described.

Figure 2:
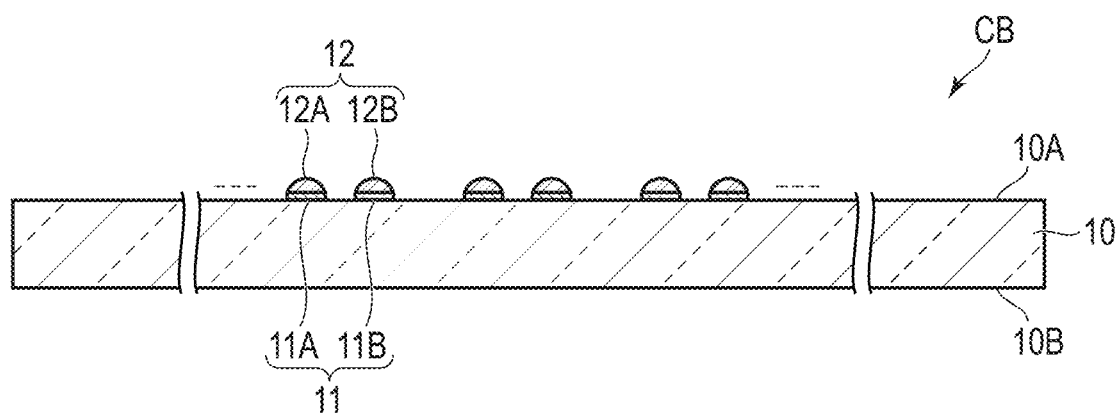
FIG. 2 is a cross-sectional view schematically showing a configuration of a circuit board.

FIG. 2 is a cross-sectional view schematically showing a configuration of the circuit board CB.

The circuit board CB comprises an insulating substrate 10, a plurality of terminal portions 11 and a plurality of joint members 12. In the circuit board CB of this embodiment, a thin-film transistor (TFT) is formed as a switching element to drive a light-emitting element, on the insulating substrate 10, which is, for example, a glass substrate. The circuit board CB may be, in some cases, referred to as a backplane substrate, TFT substrate, array substrate or the like.

The insulating substrate 10 includes a surface 10A and a surface 10B on an opposite side to the surface 10A. Although not shown in the figure, switching elements and various wiring patterns, for driving the light-emitting elements LED, are formed on the insulating substrate 10.

A plurality of terminal portions 11 are located on a surface 10A side of the insulating substrate 10. A single terminal portion 11 is constituted by a pair of a first electrode 11A and a second electrode 11B. For example, the number of terminal portions 11 formed is the same as the number of light-emitting elements LED mounted on the display device DSP. The terminal portions 11 are each made of a metal material such as aluminum (Al), titanium (Ti), molybdenum (Mo), tungsten (W) or the like, etc., or from a staked body of any of these metal materials. Of the pair of the first electrode 11A and the second electrode 11B, at least one is connected to the switching element of one pixel PX.

A plurality of joint members 12 are each disposed on the terminal portion 11. A single joint member 12 is constituted by a pair of a first joint member 12A and a second joint member 12B. The first joint member 12A is located on the respective first electrode 11A. The second joint member 12B is located on the respective second electrode 11B. Each joint member 12 is a member for joining the terminal portion 11 and a terminal portion 22 of the respective light-emitting element LED, which will be described later. As the details thereof will be described later, the joint members 12 are each made of a metal material that heats and melts by laser ablation when irradiated with laser light in a wavelength range of 400 nm to 3,000 nm, which is, for example, tin (Sn), silver (Ag) or the like. The joining members 12 may be referred to as a solder member. In the example illustrated, the joint member 12 is provided on the respective terminal portion 11, but it may as well be provided on the terminal portion 22 of the light emitting element LED, which will be described later.

Figure 3:
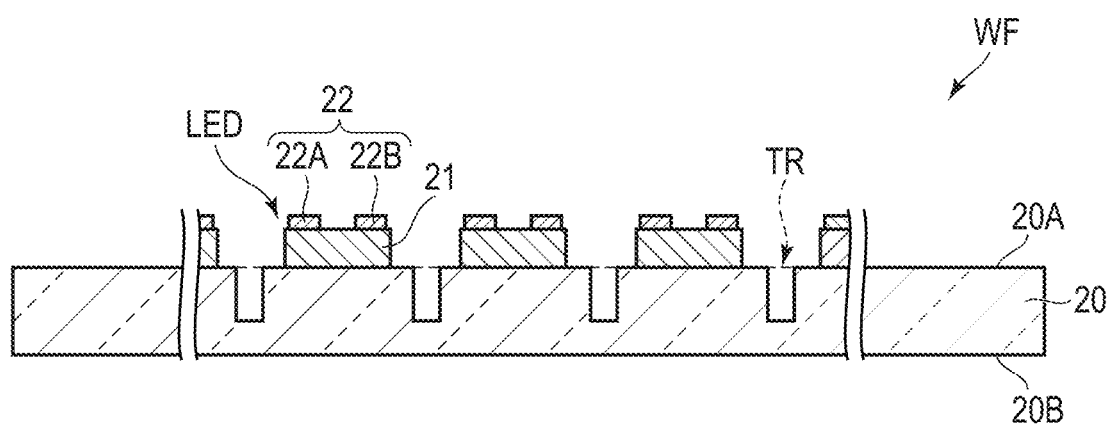
FIG. 3 is a cross-sectional view schematically showing a configuration of a wafer.

FIG. 3 is a cross-sectional view schematically showing the configuration of a wafer WF.

The wafer WF comprises a sapphire substrate 20 and a plurality of light-emitting elements (electronic components) LEDs. The sapphire substrate 20 includes a surface (a first surface) 20A and a surface (a second surface) 20B on an opposite side to the surface 20A. The sapphire substrate 20 is formed of $Al_2O_3$ (aluminum oxide).

The light-emitting element LEDs are located on the surface 20A side of the sapphire substrate 20. The light-emitting element LEDs each comprise a light-emitting layer 21 and a terminal portion 22.

The light-emitting layer 21 is fixedly attached to the surface 20A of the sapphire substrate 20 via a release layer (not shown). The terminal portions 22 are disposed on the light-emitting layer 21. One terminal portion 22 is constituted by a pair of a first electrode 22A and a second electrode 22B. One of the first electrode 22A and the second electrode 22B is equivalent to an anode electrode and the other is equivalent to a cathode electrode. The terminal portion 22 is joined to the respective terminal portion 11 by the respective joint member 12 placed on a circuit board CB side, and is electrically connected to the terminal portion 11. The terminal portion 22 may be referred to as a bump.

The sapphire substrate 20 comprises trenches TR. In the illustrated example, the trenches TR are formed in the surface 20A. Each trench portions TR is located between respective light-emitting elements LED adjacent to each other. In other words, each trench portions TR is formed at a position where it does not overlap the light-emitting elements LED. The trenches TR are formed, for example, by etching, laser processing, or physical cutting with a cutter.

Next, with reference to FIGS. 4 to 8, the mounting method for mounting the light-emitting elements LED on the circuit board CB will be described. In the following descriptions, the circuit board CB and wafer WF above-mentioned, which are stacked one on another will be referred to as a workpiece WK.

Figure 4:
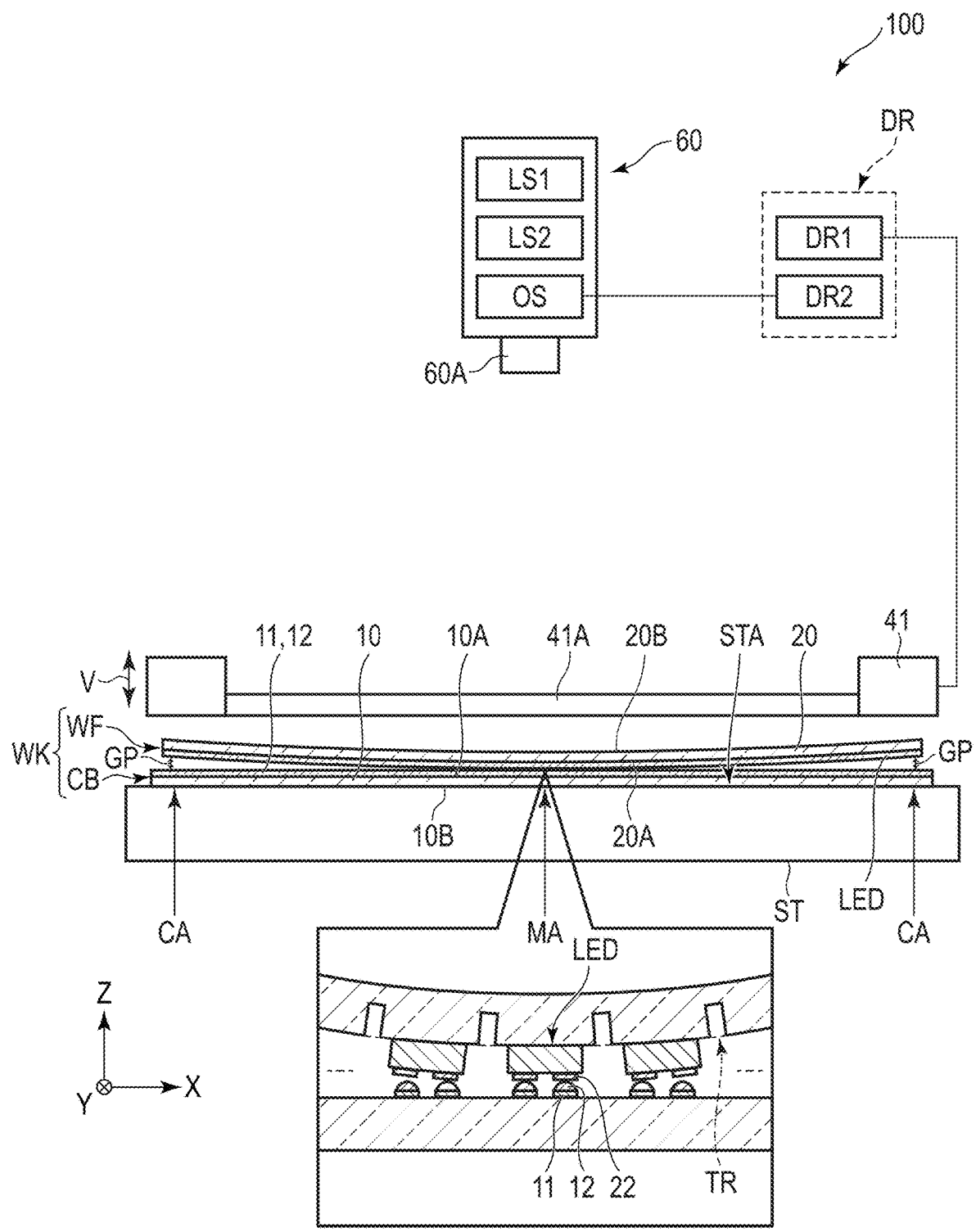
FIG. 4 is a diagram showing a first processing step of a mounting method of this embodiment.

FIG. 4 is a diagram showing the first processing step of the mounting method according to this embodiment. The first processing step is placing the workpiece WK on the stage ST. Note that the terminal portions 11 and the joint members 12 of the circuit board CB and the light-emitting elements LED of the wafer WF are illustrated respectively each as a single layer in a simplified way.

First, the configuration of the mounting device 100 will be described. The mounting device 100 is a device for mounting the light-emitting elements LED on the wafer WF onto the circuit board CB.

The mounting device 100 comprises a stage ST on which a workpiece WK is placed, a pressure jig 41, a laser device 60 and a drive unit DR.

The stage ST includes a support surface STA that supports the workpiece WK.

The pressure jig 41 opposes the stage ST along the third direction Z. The pressure jig 41 is configured to pressurize the workpiece WK between the stage ST and itself. The pressure jig 41 includes a window portion 41A opposing the support surface STA along the third direction Z. The window portion 41A is made of a transparent material, for example, and transmits laser light.

The laser device 60 comprises a first laser source LS1, a second laser source LS2, an optical system OS, and a laser head 60A. The first laser source LS1 emits a first laser beam LZ1. The second laser source LS2 emits a second laser beam LZ2 (see FIGS. 6 and 7). The optical system OS includes, for example, mirrors to adjust optical paths of the first laser beam LZ1 and the second laser beams LZ2. The laser device 60 emits the first laser beam LZ1 and the second laser beam LZ2 from the laser head 60A.

The drive unit DR comprises a first drive unit DR1 that controls the drive of the pressure jig 41, and a second drive unit DR2 that controls the drive of the laser device 60. The first drive unit DR1 moves the pressure jig 41 along a vertical direction V with respect to the support surface STA. Here, the vertical direction V is a direction parallel to the third direction Z. The second drive unit DR2 drives the laser device 60 to emit the first laser beam LZ1 and the second laser beam LZ2 therefrom. Further, the second drive unit DR2 moves the laser head 60A, for example.

Here, the first processing step will be described. A workpiece WK containing a circuit board CB and a wafer WF stacked one on another is placed between the stage ST and the pressure jig 41. Note that the pressure jig 41 may be placed on the workpiece WK after the workpiece WK is placed on the stage ST. The circuit board CB and the wafer WF are stacked one on another such that the surface 10A of the insulating substrate 10 and the surface 20A of the sapphire substrate 20 face each other. The surface 10B of the insulating substrate 10 is in contact with the support surface STA. The surface 20B of the sapphire substrate 20 opposes the pressure jig 41. When the workpiece WK is placed on the stage ST, the circuit board CB and the wafer WF are aligned with each other.

In this embodiment, it is assumed that the wafer WF is warped. In other words, there is a gap GP created partially between the circuit board CB and the wafer WF. In the example illustrated, the gap GP increases as the location is closer to a peripheral portion CA of the workpiece WK. On the other hand, in a central portion MA of the workpiece WK, the circuit board CB and the wafer WF are in contact with the circuit board CB. In other words, in the central portion MA of the workpiece WK, the terminal portions 22 of the respective light-emitting elements LED are in contact with the respective joint members 12.

Figure 5:
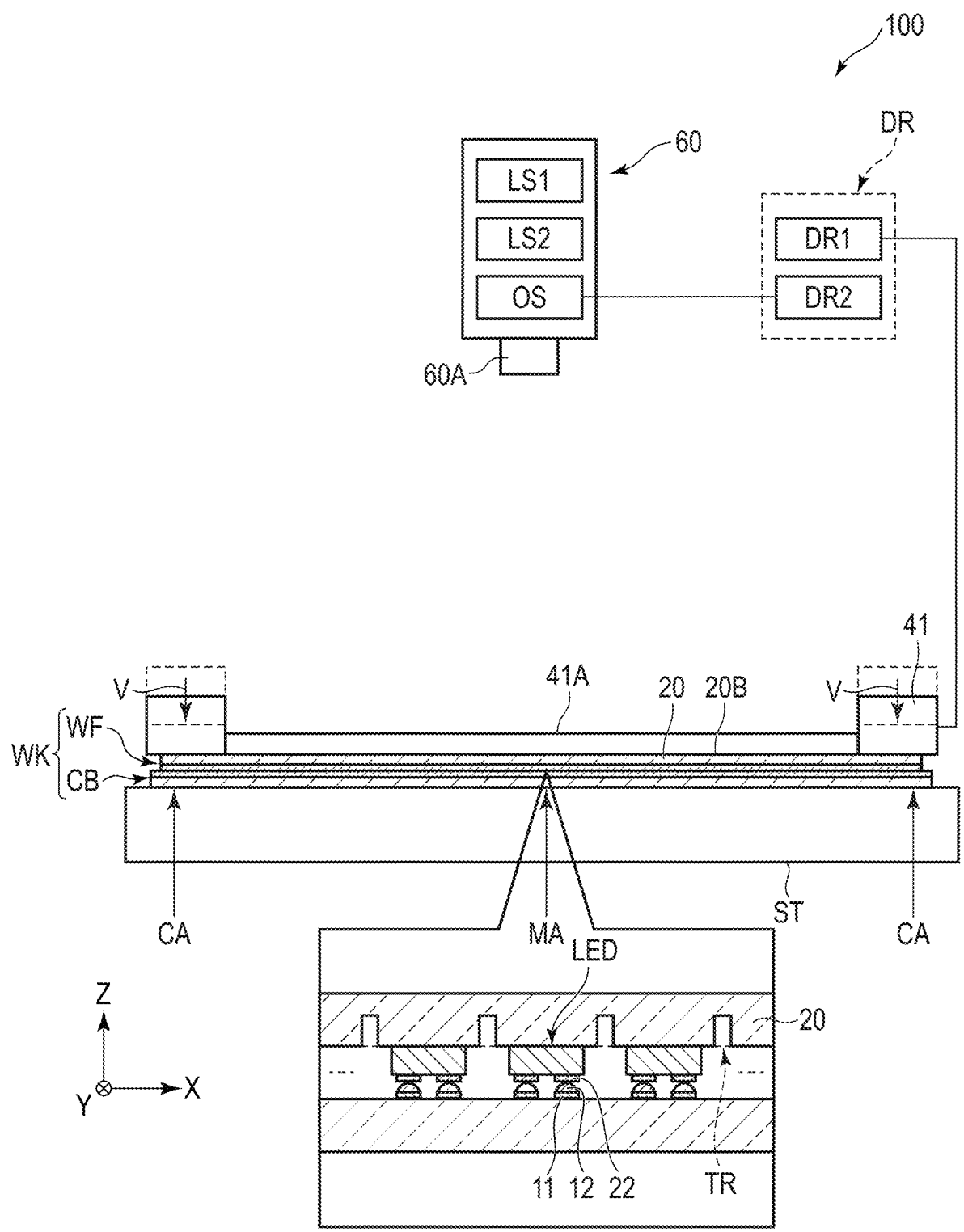
FIG. 5 is a diagram showing a second processing step of the mounting method of this embodiment.

FIG. 5 is a diagram showing a second processing step of the mounting method of this embodiment. The second processing step is pressurizing the workpiece WK to the stage ST side by the pressure jig 41.

The first drive unit DR1 moves the pressure jig 41 in the vertical direction along the vertical direction V toward the stage ST. In other words, the first drive unit DR1 presses the sapphire substrate 20 to the circuit board CB side with the pressure jig 41. As a result, the sapphire substrate 20 is flattened. The pressure jig 41 fixes the workpiece WK between the stage ST and itself. Thus, the workpiece WK is fixed while the terminal portions 11 of the circuit board CB and the terminal portions 22 of the wafer WF are superimposed on each other. The window portion 41A is in contact with the surface 20B of the sapphire substrate 20.

As described, the warp of the sapphire substrate 20 is straightened to bring the circuit board CB and the wafer WF into tight contact with each other. Thus, the light-emitting elements LED can be set to joinable to the circuit board CB.

Since the sapphire substrate 20 is formed of a highly rigid material, a large load is required to flatten the sapphire substrate 20. Therefore, the pressure jig 41 needs to be made of a material that can withstand the load of flattening the sapphire substrate 20 and that can transmit the laser beam for bonding and removing the light-emitting elements LED. Here, it is difficult to select the appropriate material.

According to this embodiment, the sapphire substrate 20 includes the trenches TR. Therefore, the rigidity of the sapphire substrate 20 can be lowered. The sapphire substrate 20 can be easily bent at the positions overlapping the respective trenches TR, and the load required to flatten the sapphire substrate 20 can be reduced. In this manner, the range of materials to be used for the pressure jig 41 can be widened.

Note that with the trenches TR, the stress between the sapphire substrate 20 and the light-emitting elements LED, which causes warpage, is reduced, and therefore the wafer WF may be already flattened before being pressurized by the pressure jig 41. Further, the depth and width of the trenches TR may be adjusted according to the degree of warpage of the sapphire substrate 20. For example, as the warpage of the sapphire substrate 20 is less, the depth and width of the trenches TR may be lessened, whereas the warpage of the sapphire substrate 20 is greater, the depth and width of the trenches TR may be increased by adjustment.

Figure 6:
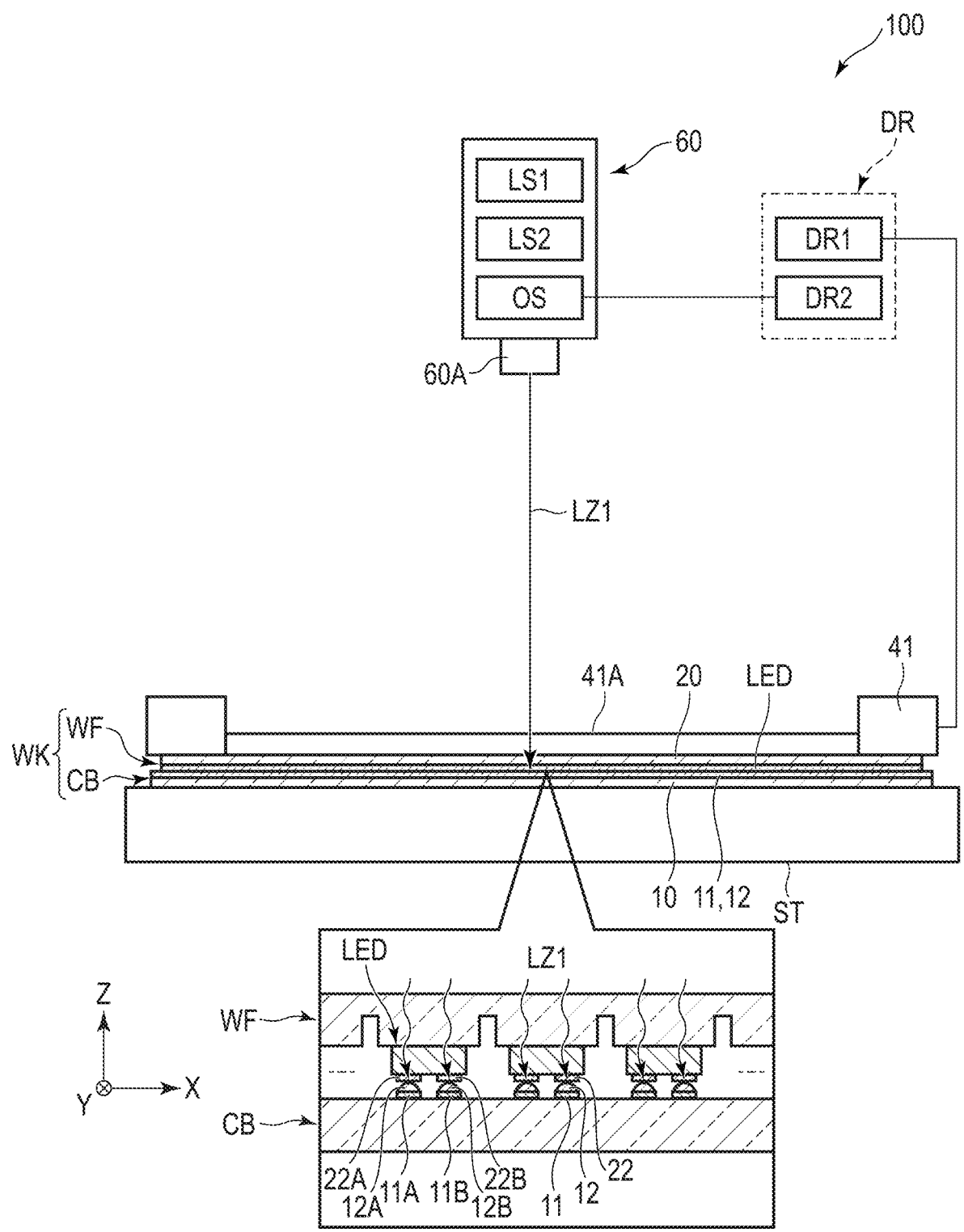
FIG. 6 is a diagram showing a third processing step of the mounting method of this embodiment.

FIG. 6 is a diagram showing a third processing step of the mounting method of this embodiment. The third processing step is irradiating the first laser beam LZ1 onto the workpiece WK.

The second drive unit DR2 drives the laser device 60 to emit the first laser beam LZ1 from the laser head 60A. The laser device 60 irradiates the first laser beam LZ1 through the window portion 41A of the pressure jig 41 onto the workpiece WK, thus joining the light-emitting elements LED to the circuit board CB. In other words, by heating and melting the joint members 12 by laser ablation, the terminal portions 11 of the circuit board CB and the terminal portions 22 of the wafer WF are respectively joined. More specifically, the first electrodes 22A are joined to the respective first electrodes 11A by the respective first joint members 12A. The second electrodes 22B are joined to the respective second electrodes 11B by the respective second joint members 12B. The wavelength range of the first laser beam LZ1 is 400 nm to 3000 nm.

Figure 7:
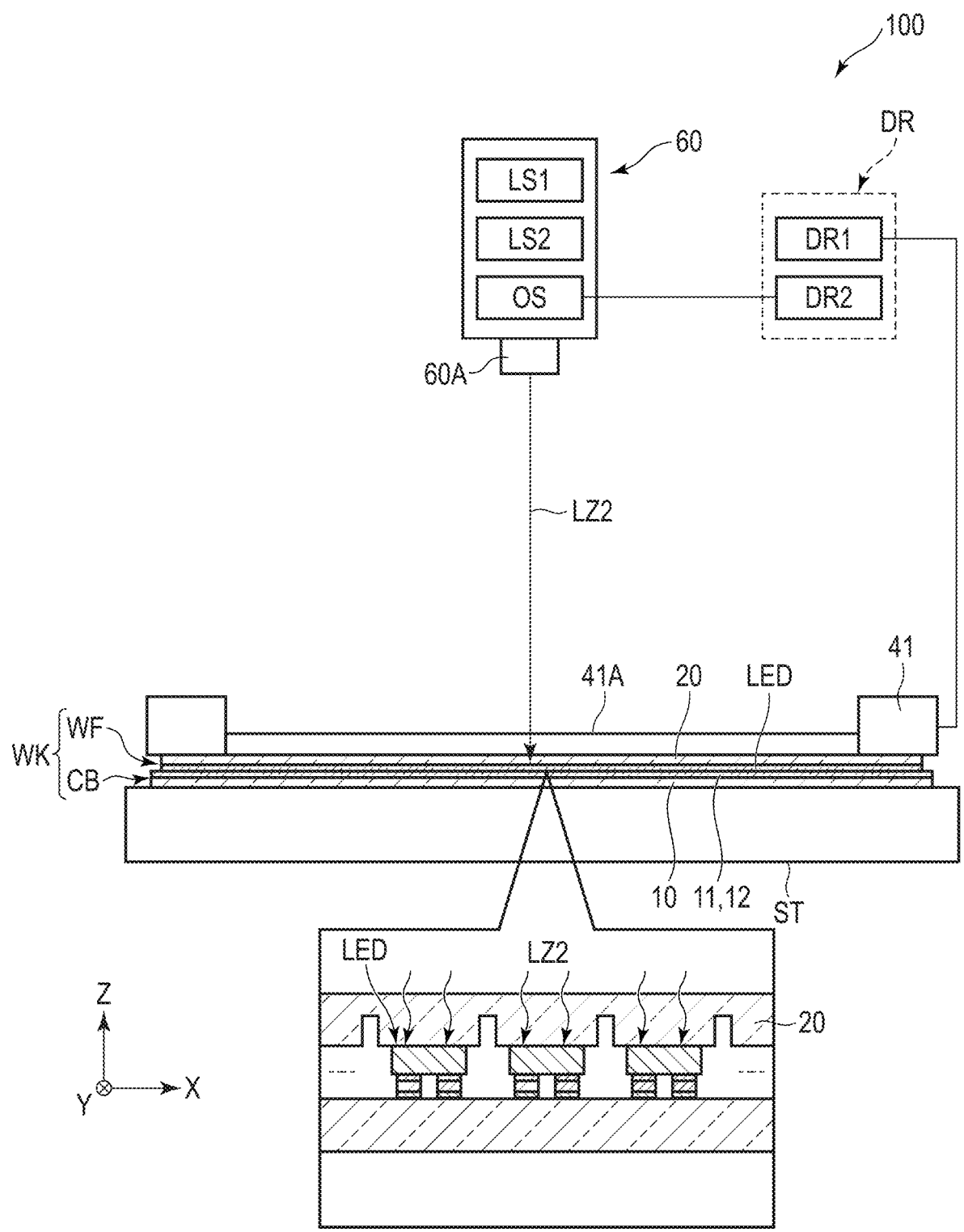
FIG. 7 is a diagram showing a fourth processing step of the mounting method of this embodiment.

FIG. 7 is a diagram showing a fourth processing step of the mounting method of this embodiment. The fourth processing step is irradiating the second laser beam LZ2 onto the workpiece WK.

The second drive unit DR2 drives the laser device 60 to emit the second laser beam LZ2 from the laser head 60A. The laser device 60 irradiates the second laser beam LZ2 via the window portion 41A of the pressure jig 41 onto the workpiece WK and removes the light-emitting elements LED from the sapphire substrate 20. That is, the releasing layer (not shown) which attaches the light-emitting elements LED from the sapphire substrate 20 is sublimated by the laser abrasion to remove them from the sapphire substrate 20. The second laser beam LZ2 has a wavelength band different from that of the first laser beam LZ1. The wavelength band of the second laser beam LZ2 is from 200 nm to 366 nm.

Figure 8:
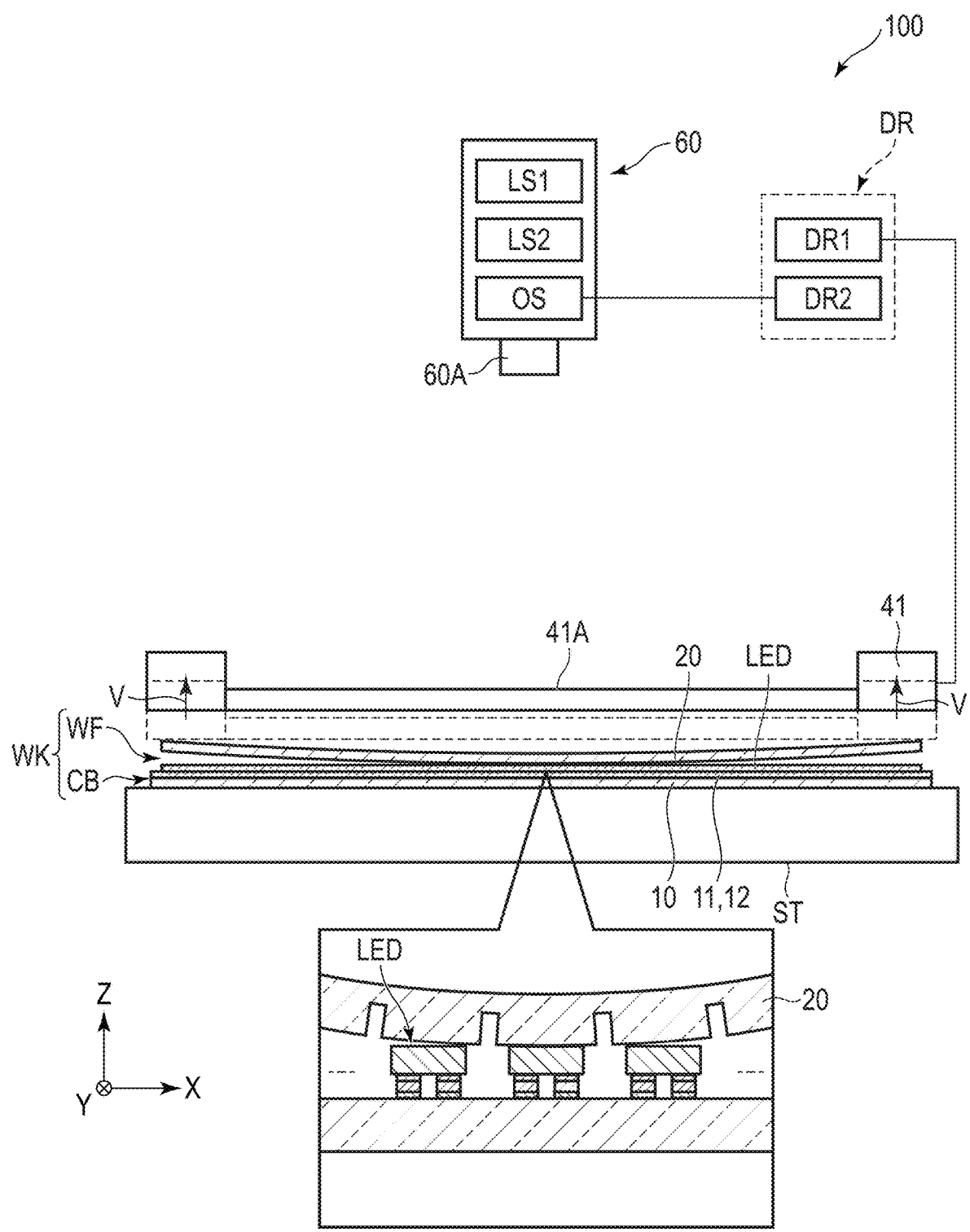
FIG. 8 is a diagram showing a fifth processing step of the mounting method of this embodiment.

FIG. 8 is a diagram showing a fifth processing step of the mounting method of this embodiment. The fifth processing step is moving the pressure jig 41.

The first drive unit DR1 moves the pressure jig 41 in the vertical direction V apart from sapphire substrate 20. In other words, the pressure jig 41 moves in the vertical direction V to the side where it is apart from the stage ST. As the pressure jig 41 is separated from the workpiece WK, the warped state of the sapphire substrate 20 restores the state shown in FIG. 4. As illustrated in the figure, the light-emitting elements LED are separated from the sapphire substrate 20.

Figure 9:
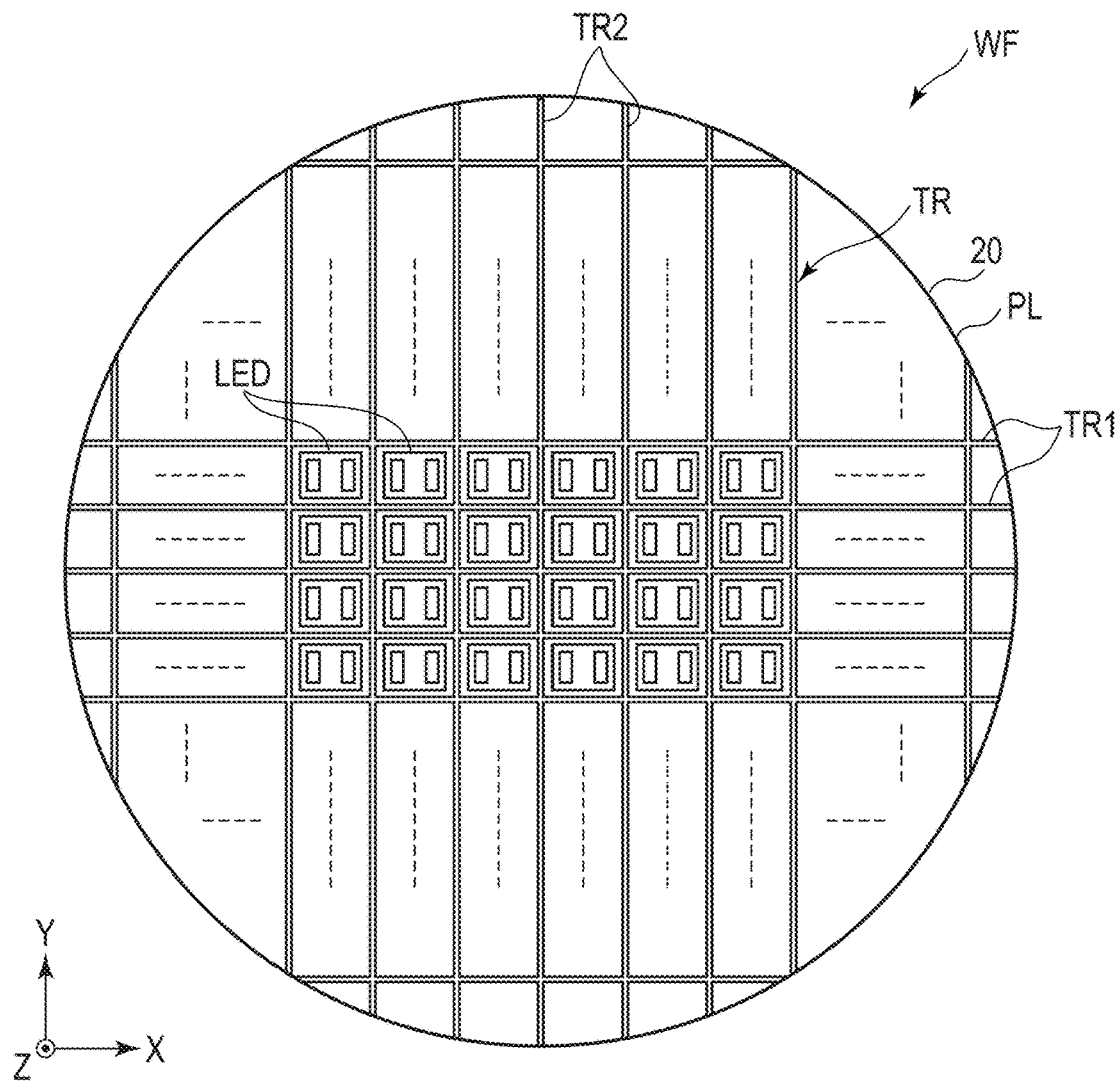
FIG. 9 is a plan view showing the wafer according to this embodiment.

FIG. 9 is a plan view showing the wafer WF of this embodiment.

The external shape of the wafer WF is circular. In other words, the outer shape of the sapphire substrate 20 is circular. Note here that the planar shape of the wafer WF is not limited to that of this example. The light-emitting elements LED are arranged in a matrix along the first direction X and the second direction Y.

The trenches TR are grid-shaped in plan view. The trench portions TR includes a plurality of first trench portions TR1 extending along the first direction X and aligned along the second direction Y, and a plurality of second trench portions TR2 extending along the second direction Y and aligned along the first direction X. The first trench portions TR1 and the second trench portions TR2 each extend to be linear in plan view. Each light-emitting element LED is surrounded in plan view by two respective adjacent first trench portions TR1 and two respective adjacent second trench portions TR2. The sapphire substrate 20 includes an outer circumference PL. The trench portions TR extend to the outer circumference PL.

In the example illustrated, the first trench portions TR1 and the second trench portions TR2 are formed to respectively surround all light-emitting elements LED. Here, note that the first trench portions TR1 may be formed for multiple light-emitting elements LED along the second direction Y, and the second trench portions TR2 may be formed for multiple light-emitting elements LED along the first direction X. The number of first trench portions TR1 and second trench portions TR2 can be adjusted according to the degree of warpage of the sapphire substrate 20. For example, as the warpage of the sapphire substrate 20 is greater, the number of the first trench portions TR1 and the second trench portions TR2 formed may be increased, or as the warpage of the sapphire substrate 20 is less, the number of the first trench portions TR1 and the second trench portions TR2 formed may be decreased by adjustment.

Figure 10:
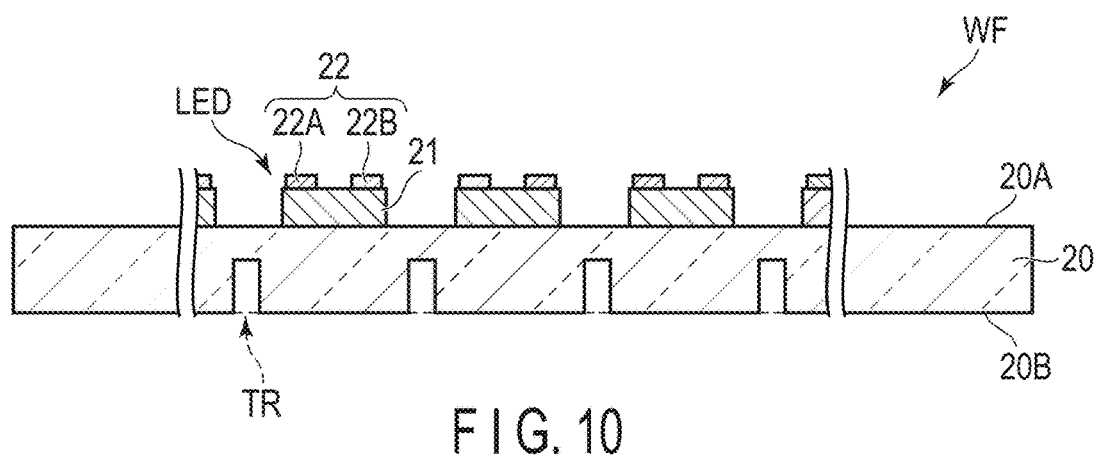
FIG. 10 is a cross-sectional view showing a modified example of the wafer.

FIG. 10 is a cross-sectional view showing a modified example of the wafer WF. The configuration shown in FIG. 10 is different from that of FIG. 3 in that the trench portions TR are formed in the surface 20B.

The trench portions TR are each located between respective adjacent light-emitting elements LED. In other words, the trench portions TR are formed at positions where they do not overlap the light-emitting elements LED. With this configuration, it is possible to suppress the first laser beam LZ1 and the second laser beam LZ2 from being diffused by the trench portions TR before reaching the light-emitting elements LED while irradiating the first laser beam LZ1 and the second laser beam LZ2 from the surface 20B side.

Figure 11:
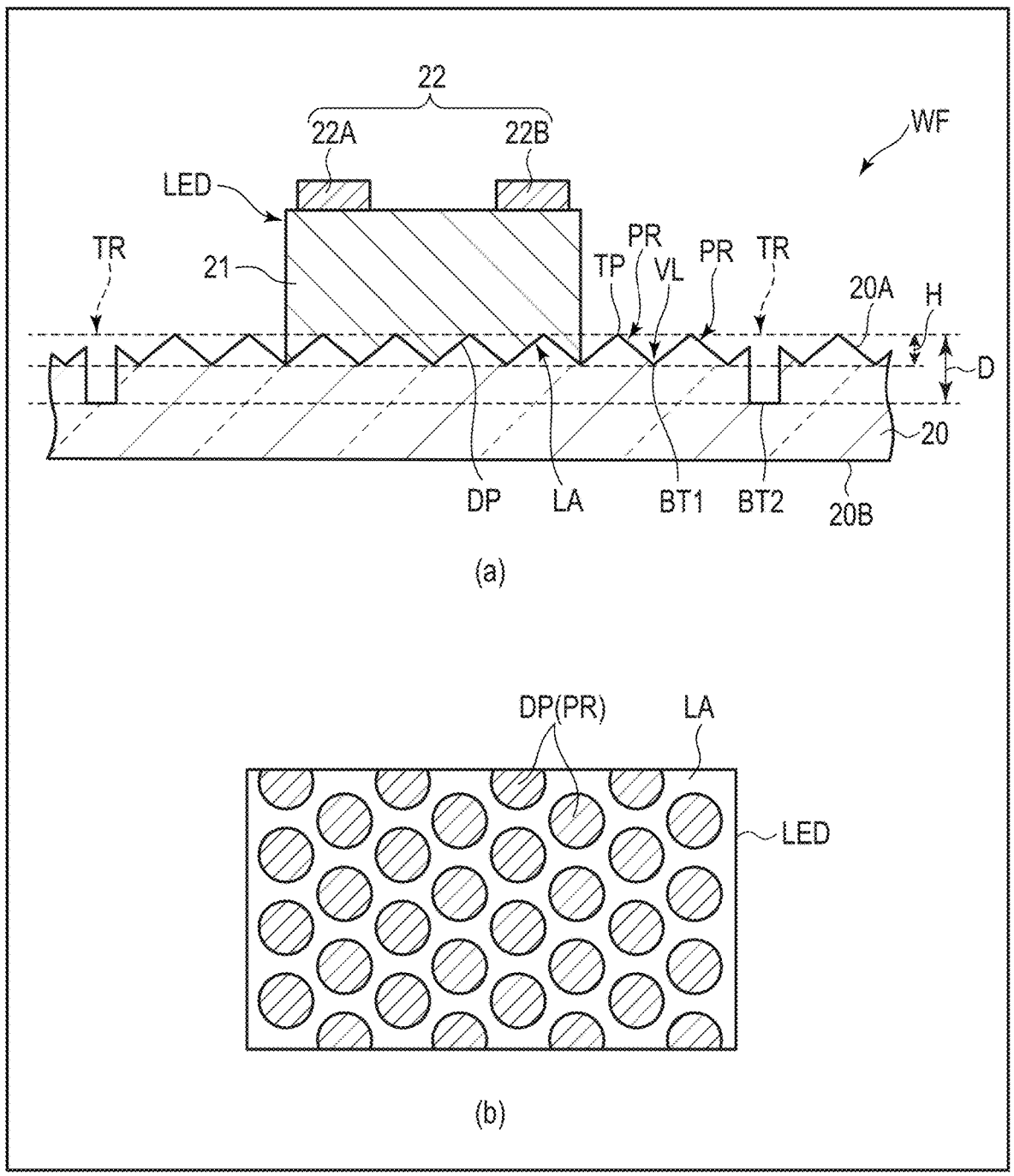
FIG. 11 is a diagram showing a detailed configuration of a sapphire substrate.

FIG. 11 is a diagram showing the detailed configuration of the sapphire substrate 20.

FIG. 11, part (a), is a cross-sectional view showing the wafer WF. The sapphire substrate 20 includes a plurality of micro-protruding portions PR formed in the surface 20A.

The sapphire substrate 20, including such micro-protruding portions PR, is referred to, for example, a patterned sapphire substrate (PSS). The protruding portions PR are formed on the entire surface of the sapphire substrate 20. For example, the protruding portions are formed into the shape of, for example, a cone, a bell, a dome or the like. For example, the trench portions TR and the projecting portions PR may be formed by the same process, in which case the trench portions TR and the projecting portions PR are formed by etching.

The light-emitting elements LED are formed by depositing a film on the projecting portions PR. The light-emitting elements LED overlap multiple protruding portions PR. The surface LA of each light-emitting element LED, which is in contact with the sapphire substrate 20, includes depressions DP formed along the configuration of the protruding portions PR. With the multiple depressions DP formed on the light-emitting element LED, light emitted from the light-emitting element LED can be scattered and diffused on the surface LA. That is, the frontal luminance of the light-emitting element LED can be improved.

The protruding portions PR have a height H. The height H is equivalent to a height taken between a top portion TP of the protruding portion PR and a bottom portion BT1 of a valley VL between respective adjacent protruding portions PR. Further, the trench portions TR has a depth D. The depth D is equivalent to the depth between the top portion TP of the projecting portion PR and a bottom portion BT2 of the respective trench portion TR. The depth D of the trench portions TR is greater than the height H of the protruding portions PR. In other words, the bottom portions BT2 are located on the surface 20B side with respect to the bottom portions BT1. The trench portions TR in this embodiment are different from the valleys VL formed between the respective adjacent protruding portions PR.

FIG. 11, part (b) is a plan view showing the surface LA of each light-emitting element LED. The depressions DP are regularly aligned. The positions where the depressions DP are formed are the same as those of the protruding portions PR, and therefore the protruding portions PR was well are aligned in a regular manner. The protruding portions PR and the depressions DP are formed smaller than the light-emitting elements LED in plan view.

As explained above, according to the embodiment, it is possible to obtain a wafer for electronic components, that can be easily flattened.

Note that the descriptions provided in this specification are provided in connection with the example case where the light-emitting elements are electronic components, but the embodiment is applicable to electronic components other than light-emitting elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wafer for electronic components for transferring without dividing, comprising:
   a sapphire substrate including a first surface and a second surface on an opposite side to the first surface; and a plurality of electronic components located on a side of the first surface, wherein the plurality of electronic components are fixedly attached to the first surface of the sapphire substrate via a release layer for releasing the electronic components from the sapphire substrate, the sapphire substrate includes trench portions located between respective adjacent electronic components, the trench portions extend linearly in plan view with respect to the first surface, the sapphire substrate includes a plurality of protruding portions formed on the first surface, and a depth of the trench portions is greater than a height of the protruding portions.

2. The wafer of claim 1, wherein
the trench portions are formed in the first surface.

3. The wafer of claim 1, wherein
the trench portions are formed in the second surface.

4. The wafer of claim 1, wherein
the sapphire substrate includes an outer circumferential edge, and
the trench portions extend to the outer circumferential edge.

5. The wafer of claim 1, wherein
the trench portions include a plurality of first trench portions extending along a first direction and aligned along a second direction intersecting the first direction, and a plurality of second trench portions extending along the second direction and aligned along the first direction, and
the electronic components are each surrounded by respective two adjacent first trench portions and respective two adjacent second trench portions in the plan view with respect to the first surface.

* * * * *